United States Patent
Rettenmaier et al.

(10) Patent No.: US 6,911,284 B2
(45) Date of Patent: Jun. 28, 2005

(54) PHOTOMASK AND METHOD FOR MANUFACTURING THE PHOTOMASK

(75) Inventors: Hans Rettenmaier, Dresden (DE); Michael Schmidt, Markt Schwaben (DE); Wolfgang Tittes, Dresden (DE)

(73) Assignee: Infineon Technologies AG, Munich (DE)

(*) Notice: Subject to any disclaimer, the term of this patent is extended or adjusted under 35 U.S.C. 154(b) by 124 days.

(21) Appl. No.: 10/273,759

(22) Filed: Oct. 18, 2002

(65) Prior Publication Data

US 2003/0077525 A1 Apr. 24, 2003

(30) Foreign Application Priority Data

Oct. 18, 2001 (DE) .......................................... 101 51 406

(51) Int. Cl.$^7$ ................................................. G01F 9/00
(52) U.S. Cl. ......................................................... 430/5
(58) Field of Search ........................ 430/5, 22; 702/85, 702/86

(56) References Cited

U.S. PATENT DOCUMENTS

| 5,691,812 | A | | 11/1997 | Bates et al. ................... 356/243 |
| 6,411,378 | B1 | * | 6/2002 | Pike ........................ 356/237.5 |
| 2002/0082789 | A1 | * | 6/2002 | Takizawa et al. ............. 702/85 |
| 2003/0194820 | A1 | * | 10/2003 | Jakatdar et al. ............... 438/16 |

* cited by examiner

*Primary Examiner*—S. Rosasco
(74) *Attorney, Agent, or Firm*—Schiff Hardin LLP

(57) ABSTRACT

A photomask for the manufacture of integrated semiconductor products has at least one first region with principal structures that correspond to structures on the integrated semiconductor structure to be manufactured and has at least one second region differing from the first region and having calibration structures which comprise at least two different, pre-defined expanses. The calibration structures contain pre-programmed flaws with predetermined sizes that are positioned on the photomask so that they do not negatively influence the functionality of the photomask. These calibration structures are then co-measured in a normal inspection, and the measured results can be subsequently normed to the detection of the calibration structures.

12 Claims, 2 Drawing Sheets

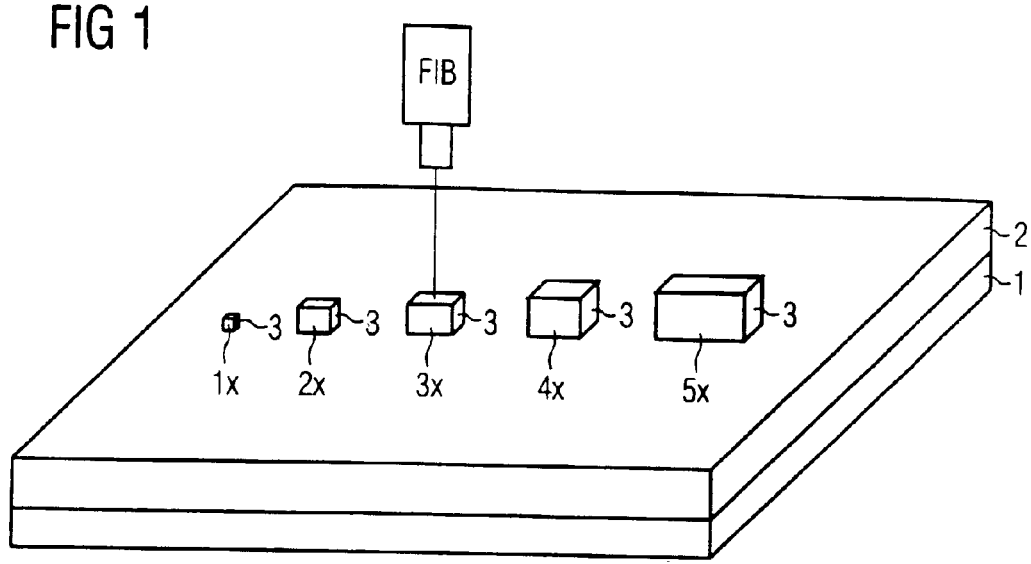
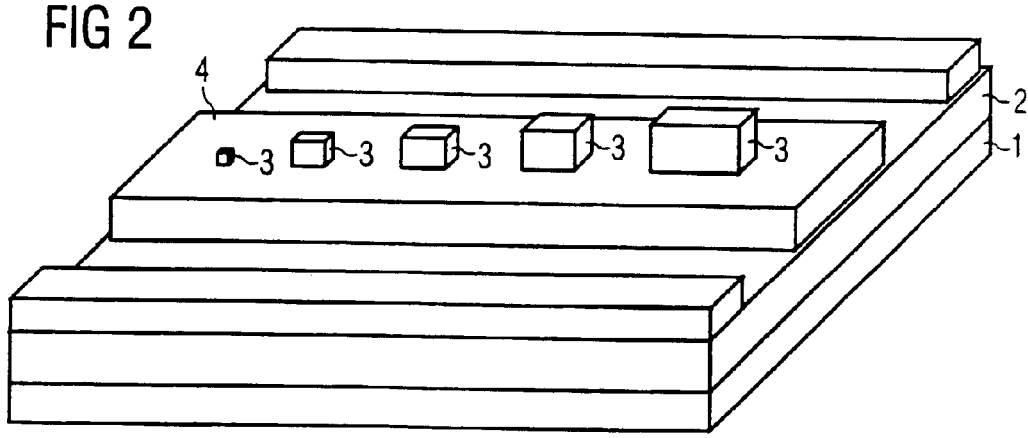

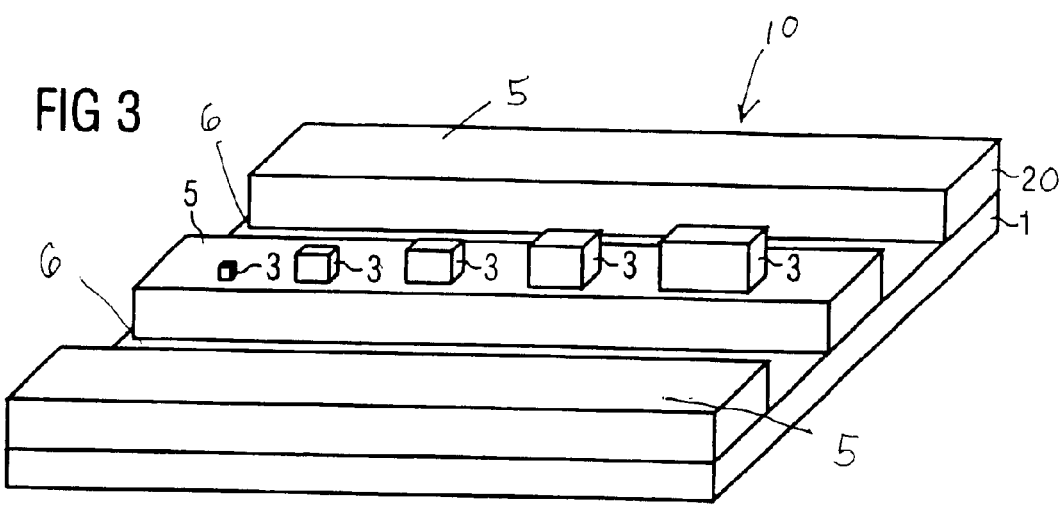

PHOTOMASK AND METHOD FOR MANUFACTURING THE PHOTOMASK

BACKGROUND OF THE INVENTION

The present invention is directed to a photomask as well as to a method for the manufacture of the photomask.

In a flaw density measurement on a photomask, the object to be measured is irradiated with light. The interaction of the light with the photomask is then analyzed. A photomask normally contains a plurality of chip fields. Each chip field is usually subdivided into individual cells. During the measurement, a gray scale value that occurs from the intensity of the analyzed light is allocated to every cell. The measured gray scale values of the cells of a chip field are then compared to a database, which would be a die or semiconductor to database inspection, and the database contains a corresponding design realized in the chip field. It is also possible to compare the corresponding gray scale values of an identical chip field on the same photomask, which would be a die-to-die inspection.

Two methods for the inspection of photomasks are usually implemented, and these are a bright field inspection and a dark field inspection. In the bright field inspection, the illumination of the photomask occurs perpendicularly from above. The light that is perpendicularly reflected upward or the light that penetrates through the photomask is analyzed. In the dark field inspection, the illumination of the photomask occurs perpendicularly from above or given lateral incidence. The light reflected upward in various spatial directions is then analyzed.

In addition to containing the information of a potentially present flaw, the intensity of the reflected light always mainly contains parts that arise due to dispersion or reflection of the light at the structure realized in the chip field. These parts are, in turn, dependent on the design of the respective chip. The intensity of these parts and their spatial distribution significantly determine the obtainable precision of the measurement.

Inspections of different designs or products thereof never have sensitivities that are comparable to one another. This is not a problem in the inspection of mass-produced products in semiconductor wafer manufacture. So many identical wafers are always measured, that a stable trend will occur. A process or system problem then shows up as a violation of a defined specification.

This trend, however, practically never occurs in the fabrication of photomasks, since only very small piece numbers, usually less than 10, of each photomask are fabricated, and the sensitivities of the inspection results of different groups of masks are not comparable due to the different designs. When the stability of a manufacturing tool for the manufacture of a photomask is nonetheless to be monitored, a way must be found for comparing inspection results of various products and designs to one another.

In the inspection of surfaces of semiconductor wafers, it is known to provide a wafer having standard artificial defects to be used for calibrating the inspection device. An example of this is disclosed in U.S. Pat. No. 5,691,812, whose disclosure is incorporated herein by reference thereto.

SUMMARY OF THE INVENTION

It is the object of the present invention to make available a photomask as well as a method for the manufacture of the photomask that clearly alleviates or, respectively, entirely avoids the above-mentioned difficulties.

This object is achieved by a photomask for manufacturing of integrated semiconductor product, which photomask comprises at least one first region with principal structures that correspond to structures on the integrated semiconductor product to be manufactured and has at least one second region differing from the first region and having calibration structures, which calibration structures comprise at least two different, pre-defined expanses.

The inventive photomask, thus, contains "preprogrammed flaws" with predetermined sizes that are positioned on the photomask so that they do not negatively influence the functionality of the photomask. These calibration structures are then co-measured in a normal inspection, and the measured result can be subsequently normed to the detection of the calibration structure. In addition, the calibration structures can be easily removed, since their exact position and nature are known.

With the assistance of the inventive photomask, inspections of various designs or products can now also be reproducibly implemented, even given very small item numbers. In particular, inspection results of various products and designs can be compared to one another. When little structure-caused noise is present in the measured signal, then the small, programmed flaws or calibration structures are also detected in the inspection. When a great deal of structure-caused noise is present, then only the large calibration structures will be visible. When the typical flaw size distribution of the product systems are known, then a statement about absolute flaw densities, with reference to the flaw size, on the photomask can be made. Inspection results of different designs, thus, also are comparable.

In addition, the method for manufacturing the photomask for the manufacture of integrated semiconductor products is inventively offered that comprises the following steps:

providing or preparing a radiation-transmissive substrate with at least one radiation-opaque layer;

generating openings in the radiation-opaque layer, so that at least one first region with principal structures is formed, said principal structures corresponding to structures on the integrated semiconductor product to be manufactured; and applying calibration structures having different, pre-defined expanses onto the radiation-opaque layer in a second region that differs from the first region.

It should be pointed out that the application of the calibration structures and the step of generating the openings can be implemented in a different sequence than that mentioned above. For example, the calibration structures can be formed on the radiation-opaque layer before the openings are created in this layer.

According to a preferred embodiment of the inventive photomask, the calibration structures respectively comprise an expanse between 50 nm and 500 nm. In addition, it is especially preferred when the calibration structures are respectively fashioned as an elevation.

According to another preferred embodiment, the distance between two calibration structures is greater than 50 $\mu$m, and preferably greater than 100 $\mu$m. A possible unwanted cluster formation by the inspection software is prevented by means of selecting a correspondingly large distance between the calibration structures. The result of a cluster formation would be that individual, small programmed flaws would appear as a large programmed flaw.

According to another preferred embodiment, the photomask comprises a radiation-transmissive substrate and at least one radiation-opaque layer. It is also preferred when the principal structures are formed with the assistance of openings in the radiation-opaque layer.

According to a preferred embodiment of the inventive method for manufacturing a photomask, the calibration structures are applied onto the radiation-opaque layer with a focused ion beam. It is thereby especially preferred when a Ga ion beam is employed. The employment of a focused ion beam has the advantage that no further structuring steps that could negatively affect the principal structures are needed for generating the calibration structures.

According to another preferred embodiment of the inventive method for manufacturing a photomask, a glass is employed as a radiation-transmissive structure. It is also preferred that a chromium layer is employed as the radiation-opaque layer.

Other advantages and features of the invention will be readily apparent from the following description of the preferred embodiments, the claims and drawings.

BRIEF DESCRIPTION OF THE DRAWINGS

FIGS. 1, 2 and 3 show various steps in the inventive method for manufacturing a photomask, with FIG. 1 showing the formation of a plurality of calibration structures on the surface of the radiation-opaque layer,0

FIG. 2 showing the development of the photoresist mask, and

FIG. 3 showing the formation of the openings in the radiation-opaque layer to form the photomask.

DESCRIPTION OF THE PREFERRED EMBODIMENTS

The principles of the present invention are particularly useful when incorporated in a photomask, generally indicated at 10 in FIG. 3. The mask 10 includes a radiation-transmissive substrate 1, which is preferably a glass substrate, which supports at least one radiation-opaque layer 20, which has been structured to leave structures 5 with openings 6 to allow passage of the radiation. As illustrated in FIG. 3, calibration structures 3 of a predetermined, defined size are provided on the structures, such as 5, which are spaced from the openings 6.

To form the mask 10, a radiation-transmissive substrate 1, preferably a glass substrate, with at least one radiation-opaque layer 2 (see FIG. 1) is prepared or provided. The calibration structures 3 of the predetermined, defined size are subsequently deposited on the one radiation-opaque layer by means of a focused ion beam and, as illustrated, are placed in an area that is subsequently to be a non-transparent region of the later-produced photomask. As illustrated in FIG. 1, the structures 3 are formed by a focused ion beam generator, such as FIB.

In the next step, a photoresist mask 4 that defines the principal structures 5 of FIG. 3 is generated by means of lithography. First, a lacquer layer is applied on the layer 2 and structures 3, which form an image in the photoresist, as shown in FIG. 2. After development of the photoresist mask 4, an etching of the radiation-opaque layer 2 is implemented to form openings 6 in the radiation-opaque layer and leave the principal structure 5, as shown in FIG. 3. The calibration structures are still present after the etching. The photoresist mask 4 is subsequently removed to provide the photomask 10 of FIG. 3.

In a subsequently-implemented inspection, the dispersed light from these calibration structures is also present in the measured results, so that a corresponding norming of the measured results can be implemented. For example, respectively, ten calibration structures or program flaws having a size of 110 nm, 140 nm, 170 nm and 200 nm are deposited onto a track, where they will not be disruptive later, on what is referred to as a "GC mask". When all the program flaws up to 170 nm and an additional 15 applied particles are detected in an inspection, then it can be derived therefrom that the 15 particles have a size greater than 170 nm normed to the programmed flaws.

When, in contrast, all the program flaws up to 110 nm and an additional two applied particles, which are known to have a particle size of 300 μm by means of an optical review, are detected in an inspection, then it can only be derived that no further ones, other than the two detected particles, are present on the mask, since they would absolutely have had to have been found, due to the detection of the 110 nm calibration structures.

This conclusion could not be possible without the calibration structures, since one would not know whether particles smaller than those detected either a) are not present or b) were not detected due to the specific optical properties of the investigated product.

When typical flaw size distributions of the production system are known, then a statement about the absolute flaw densities, with reference to flaw sizes, on the reticle can be made in this way. Inspection results of different reticle designs are, thus, also possible.

Although various minor modifications may be suggested by those versed in the art, it should be understood that we wish to embody within the scope of the patent granted hereon all such modifications as reasonably and properly come within the scope of our contribution to the art.

We claim:

1. A photomask for the manufacture of integrated semiconductor products, said mask comprising a radiation-transmissive substrate and at least one radiation-opaque layer; at least one first region with principal structures that correspond to the structures on the integrated semiconductor product to be manufactured, the principal structure being fashioned with the assistance of openings in the radiation-opaque layer; and at least one second region differing from the first region and having calibration structures, said calibration structures comprising at least two different pre-defined expanses being arranged on the radiation-opaque layer.

2. A photomask according to claim 1, wherein the calibration structures comprise an expanse between 50 nm and 500 nm.

3. A photomask according to claim 1, wherein the calibration structures are respectively fashioned as an elevation.

4. A photomask according to claim 1, wherein the distance between two calibration structures is greater than 50 μm.

5. A photomask according to claim 4, wherein the distance between two calibration structures is greater than 100 μm.

6. A photomask according to claim 1, wherein the radiation-transmissive substrate is glass and the radiation-opaque layer is a chromium layer on glass.

7. A method for manufacturing a photomask for the manufacture of integrated semiconductor products, said method comprising the steps of preparing a radiation-transmissive substrate with at least one radiation-opaque layer; forming openings in the radiation-opaque layer so that at least one first region with a principal structure is formed, said principal structure corresponding to structures on the integrated semiconductor product to be manufactured; and applying calibration structures having different, pre-defined expanses onto the radiation-opaque layer in a second region different from the first region.

8. A method according to claim 7, wherein the calibration structures are applied on the radiation-opaque layer with a focused ion beam.

9. A method according to claim 8, wherein the focused ion beam is a Ga ion beam.

10. A method according to claim 7, wherein the radiation-opaque structure is glass.

11. A method according to claim 10, wherein the radiation-opaque layer is a chromium layer.

12. A method according to claim 7, wherein the radiation-opaque layer is a chromium layer.

* * * * *